(12) United States Patent
Moon et al.

(10) Patent No.: US 8,158,878 B2
(45) Date of Patent: Apr. 17, 2012

(54) THIN FILM SOLAR CELL MODULE

(75) Inventors: Taeho Moon, Seoul (KR); Heonmin Lee, Seoul (KR); Sehwon Ahn, Seoul (KR); Youngjoo Eo, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 12/915,825

(22) Filed: Oct. 29, 2010

(65) Prior Publication Data

US 2011/0100414 A1  May 5, 2011

(30) Foreign Application Priority Data

Oct. 30, 2009  (KR) .................. 10-2009-0104069

(51) Int. Cl.
*H02N 6/00* (2006.01)
*H01L 31/042* (2006.01)

(52) U.S. Cl. ........................................ 136/244

(58) Field of Classification Search .............. 136/244, 136/256
See application file for complete search history.

(56) References Cited

U.S. PATENT DOCUMENTS

| | | | | |
|---|---|---|---|---|
| 4,301,322 A * | 11/1981 | Amick | ........................... | 136/256 |
| 4,316,049 A * | 2/1982 | Hanak | ........................... | 136/244 |
| 4,638,110 A * | 1/1987 | Erbert | ........................... | 136/246 |
| 5,593,901 A * | 1/1997 | Oswald et al. | ................... | 438/80 |
| 5,998,729 A * | 12/1999 | Shiomi et al. | .................. | 136/251 |
| 2001/0054262 A1* | 12/2001 | Nath et al. | ................... | 52/173.3 |
| 2002/0119592 A1 | 8/2002 | Oswald et al. | | |
| 2005/0126622 A1* | 6/2005 | Mukai et al. | ................... | 136/251 |
| 2005/0272175 A1 | 12/2005 | Meier et al. | | |
| 2008/0023065 A1 | 1/2008 | Borden et al. | | |

* cited by examiner

*Primary Examiner* — Jennifer Michener
*Assistant Examiner* — Eli Mekhlin
(74) *Attorney, Agent, or Firm* — McKenna Long & Aldridge LLP

(57) ABSTRACT

A thin film solar cell module is disclosed. The thin film solar cell module includes a substrate and a plurality of cells each including a first electrode positioned on the substrate, a second electrode positioned on the first electrode, and a photoelectric transformation layer positioned between the first electrode and the second electrode. The plurality of cells are divided into a first group and a second group. A plurality of cells included in the first group are electrically connected in series to one another, and a plurality of cells included in the second group are electrically connected in series to one another. The first group and the second group are connected in parallel to each other using a lead wire. The lead wire is positioned on both the first group and the second group.

18 Claims, 13 Drawing Sheets

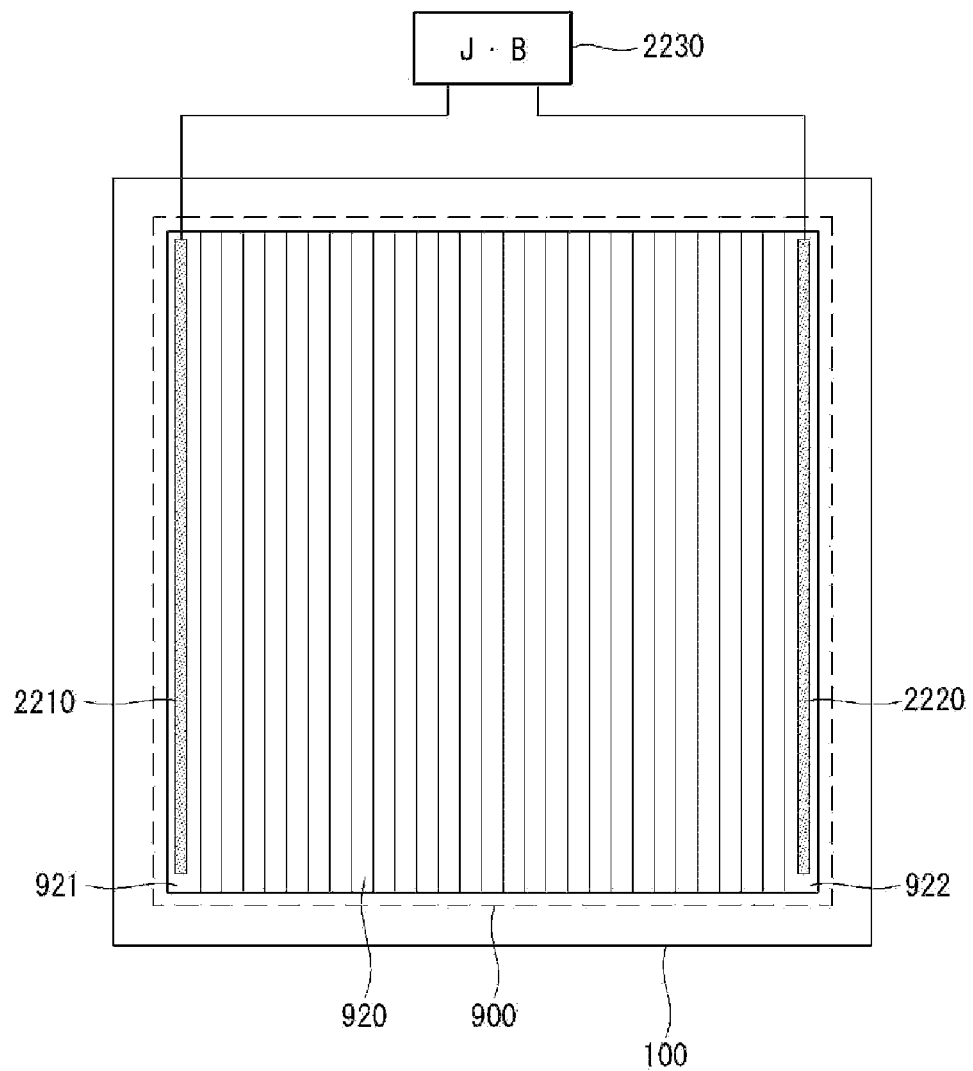

THIN FILM SOLAR CELL MODULE

This application claims priority to and the benefit of Korean Patent Application No. 10-2009-0104069 filed in the Korean Intellectual Property Office on Oct. 30, 2009 filed in the Korean Intellectual Property Office on the entire contents of which are incorporated herein by reference.

BACKGROUND OF THE INVENTION

1. Field of the Invention

Exemplary embodiments of the invention relate to a thin film solar cell module.

2. Description of the Related Art

A solar cell is an element capable of converting light energy into electrical energy and includes a p-type semiconductor and an n-type semiconductor.

If light coming from the outside is incident on the solar cell, a plurality of electron-hole pairs are formed inside the semiconductor of the solar cell due to the incident light. The electrons move to the n-type semiconductor and the holes move to the p-type semiconductor due to an electric field generated inside the solar cell. Hence, electric power is produced.

The solar cell may be typically classified into a silicon-based solar cell, a compound-based solar cell, and an organic-based solar cell depending on the material used. The silicon-based solar cell may be classified into a crystalline silicon (c-Si) solar cell and an amorphous silicon (a-Si) solar cell depending on a phase of a semiconductor.

The thin film solar cell is a representative example of the a-Si solar cell. Because the thin film solar cell does not use a silicon substrate, it is easy to implement the large-sized thin film solar cell at low cost.

SUMMARY OF THE INVENTION

In one aspect, there is a thin film solar cell module including a substrate and a plurality of cells each including a first electrode positioned on the substrate, a second electrode positioned on the first electrode, and a photoelectric transformation layer positioned between the first electrode and the second electrode. The plurality of cells are divided into a first group and a second group. A plurality of cells included in the first group are electrically connected in series to one another, and a plurality of cells included in the second group are electrically connected in series to one another. The first group and the second group are connected in parallel to each other using a lead wire. The lead wire is positioned on both the first group and the second group.

The first group may include a first outermost cell farthest from the second group and a second outermost cell closest to the second group, and the second group includes a third outermost cell closest to the first group and a fourth outermost cell farthest from the first group. The lead wire includes a first lead wire and a second lead wire. In this case, a first bus bar electrode having a first polarity in the first outermost cell may be electrically connected in parallel to a bus bar electrode having the first polarity in one of the third and fourth outermost cells through the first lead wire positioned on the first group or the second group. Further, a second bus bar electrode having a second polarity in the second outermost cell may be electrically connected in parallel to a bus bar electrode having the second polarity in the other of the third and fourth outermost cells through the second lead wire positioned on the first group or the second group.

The first bus bar electrode having the first polarity in the first outermost cell may be electrically connected to a third bus bar electrode having the first polarity in the third outermost cell through the first lead wire. The second bus bar electrode having the second polarity in the second outermost cell may be electrically connected to a fourth bus bar electrode having the second polarity in the fourth outermost cell through the second lead wire.

The first bus bar electrode may be positioned on the first outermost cell and may be electrically connected to a first electrode of the first outermost cell. The second bus bar electrode may be positioned on the second outermost cell and may be electrically connected to a second electrode of the second outermost cell. The third bus bar electrode may be positioned on the third outermost cell and may be electrically connected to a first electrode of the third outermost cell. The fourth bus bar electrode may be positioned on the fourth outermost cell and may be electrically connected to a second electrode of the fourth outermost cell, The thin film solar cell module may further include a first insulating layer that is formed using a nonconductive material in the first group between the first lead wire and the second bus bar electrode and except the area where the first lead wire and the first bus bar electrode are connected, and a second insulating layer that is formed using a nonconductive material in the second group between the second lead wire and the third bus bar electrode and except the area where the second lead wire and the fourth bus bar electrode are connected.

A width of each of the insulating layers may be greater than a width of each of the first lead wire and the second lead wire.

The thin film solar cell module may further include a junction box that collects electric power produced by the first and second groups. The junction box may be electrically connected to the second bus bar electrode and the third bus bar electrode.

Lengths of the second bus bar electrode and the third bus bar electrode may be shorter than lengths of the first bus bar electrode and the fourth bus bar electrode.

The junction box may be positioned on both the first and second groups.

The first bus bar electrode having the first polarity in the first outermost cell may be electrically connected in parallel to a fourth bus bar electrode having the first polarity in the fourth outermost cell through the first lead wire. The second bus bar electrode having the second polarity in the second outermost cell may be electrically connected in parallel to a third bus bar electrode having the second polarity in the third outermost cell through the second lead wire.

When the first group includes a first cell and a second cell and the second group includes a third cell and a fourth cell, the first electrode of the first cell and the second electrode of the second cell may be connected in series to each other, or the second electrode of the first cell and the first electrode of the second cell may be connected in series to each other. Further, the first electrode of the third cell and the second electrode of the fourth cell may be connected in series to each other, or the second electrode of the third cell and the first electrode of the fourth cell may be connected in series to each other.

When the first to fourth cells are successively positioned, the first electrode of the second cell and the second electrode of the third cell may be separated from each other, and the second electrode of the second cell and the first electrode of the third cell may be separated from each other.

An insulating layer formed of a nonconductive material may be positioned between the first and second groups on the substrate. The first group and the second group may be physically and electrically separated from each other by the insulating layer.

A distance between the second electrode of the second cell and the second electrode of the third cell may be greater than a distance between the second electrode of the first cell and the second electrode of the second cell and a distance between the second electrode of the third cell and the second electrode of the fourth cell.

At least one of a distance between the first electrode of the second cell and the first electrode of the third cell and a distance between the second electrode of the second cell and the second electrode of the third cell may be less than at least one of a width of the first electrode and a width of the second electrode.

A distance between the substrate and the first electrode may be less than a distance between the substrate and the second electrode. A distance between the first electrode of the second cell and the first electrode of the third cell may be greater than a distance between the first electrode of the first cell and the first electrode of the second cell and a distance between the first electrode of the third cell and the first electrode of the fourth cell.

A width of the first electrode of at least one of the second and third cells may be greater than widths of the first electrodes of the first and fourth cells.

A width of the first electrode of at least one of the second and third cells may be less than widths of the first electrodes of the first and fourth cells.

A width of the photoelectric transformation layer of at least one of the second and third cells may be different from widths of the photoelectric transformation layers of the first and fourth cells.

A width of the photoelectric transformation layer of at least one of the second and third cells may be equal to or great than widths of the photoelectric transformation layers of the first and fourth cells.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 9 to 22 illustrate a thin film solar cell module according to an exemplary embodiment of the invention.

DETAILED DESCRIPTION OF THE EMBODIMENTS

Figure 1:
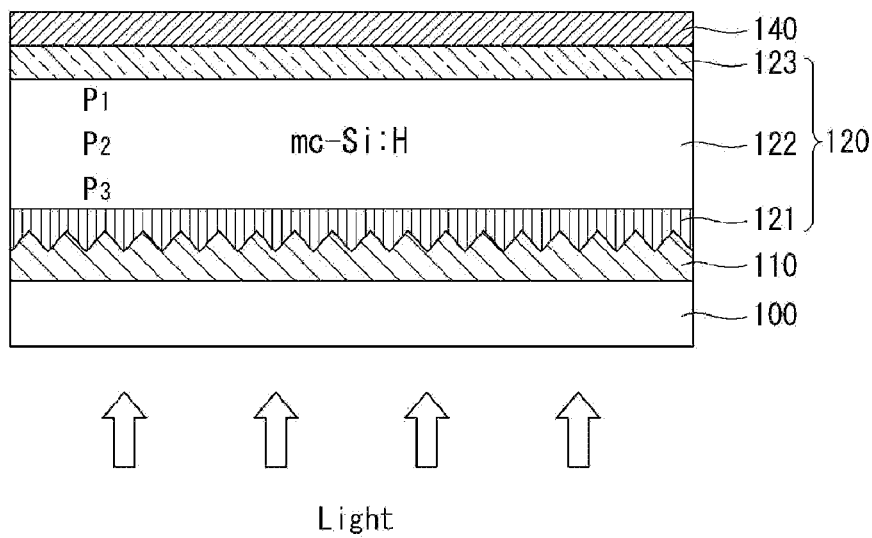
FIGS. 1 to 8 illustrate a thin film solar cell according to an exemplary embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

Figure 9:
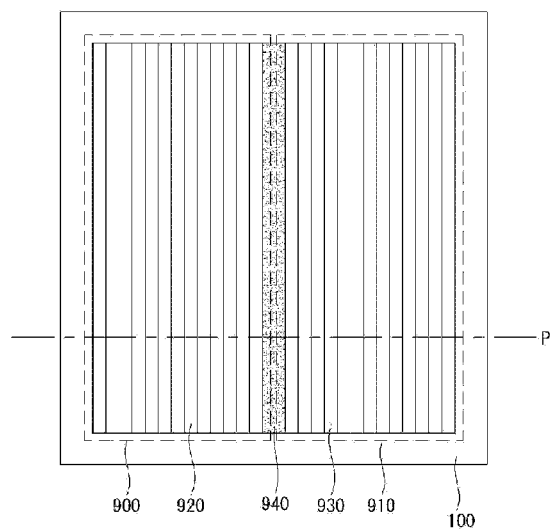
Figure 10:
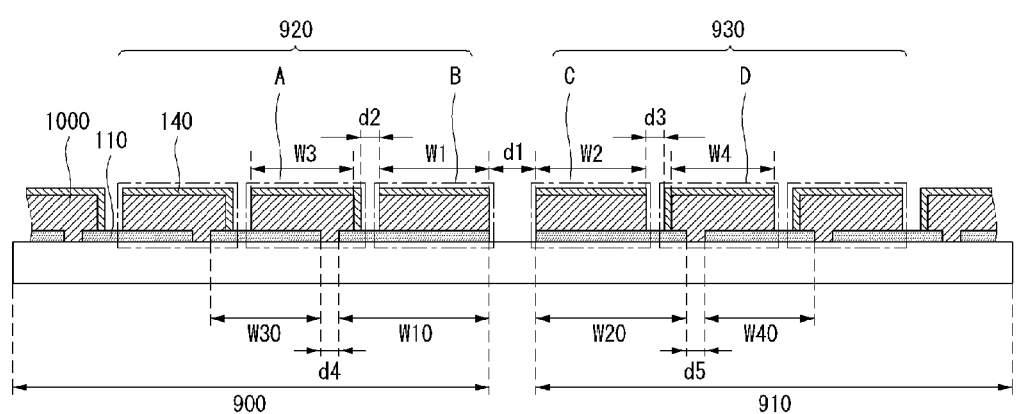
Figure 11:
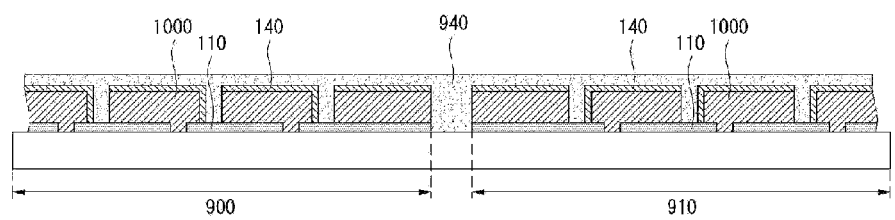

A thin film solar cell module according to an exemplary embodiment of the invention includes a substrate and a plurality of cells positioned on the substrate. The plurality of cells are divided into at least two groups, for example as shown in FIGS. 9-11, a first group 900 and a second group 910. The plurality of cells belonging to each of the first and second groups 900 and 910 are electrically connected in series to one another, and the first group 900 and the second group 910 are connected in parallel to each other through electrically conductive lead wires. The lead wires are positioned on both the first and second groups 900 and 910.

The above-described thin film solar cell module may control an output voltage of the thin film solar cell module without a reduction in the efficiency of a thin film solar cell. Further, because the lead wire for connecting some cells of the first group 900 in parallel to some cells of the second group 910 is formed on both the first and second groups 900 and 910, the size of an edge portion of the thin film solar cell module does not need to increase. Hence, an effective area of the thin film solar cell module may increase.

In the embodiments of the invention, the internal structure of each of the plurality of cells and a serial connection relationship between the plurality of cells are described. Subsequently, a parallel connection relationship between the first and second groups 900 and 910 is described.

FIGS. 1 to 8 illustrate a thin film solar cell according to an exemplary embodiment of the invention. A structure of the thin film solar cell shown in FIGS. 1 and 2 may be referred to as a pin structure.

As shown in FIG. 1, a thin film solar cell 10 according to an exemplary embodiment of the invention includes a substrate 100 and a front electrode 110, a back electrode 140, and a photoelectric transformation unit 120 that are positioned on the substrate 100.

The front electrode 110 is positioned on the substrate 100, and the back electrode 140 is positioned on the front electrode 110. The photoelectric transformation unit 120 is positioned between the front electrode 110 and the back electrode 140 to produce electric power using light incident thereon. Further, the photoelectric transformation unit 120 may include an intrinsic semiconductor layer 122 formed of microcrystalline silicon. The intrinsic semiconductor layer 122 may be referred to as an i-type semiconductor layer. Further, the front electrode 110 may be referred to as a first electrode, and the back electrode 140 may be referred to as a second electrode.

The substrate 100 may provide a space for other functional layers. The substrate 100 may be formed of a substantially transparent material, for example, glass or plastic, so that the incident light efficiently reaches the photoelectric transformation unit 120.

The front electrode 110 may be formed of a substantially transparent material with electrical conductivity so as to increase a transmittance of incident light. For example, the front electrode 110 may be formed of a material having a high transmittance and the high electrical conductivity, so that the front electrode 110 transmits most of incident light and a current smoothly flows in the front electrode 110. The material of the front electrode 110 may be selected from the group consisting of indium tin oxide (ITO), tin-based oxide (for example, $SnO_2$), AgO, $ZnO$—$Ga_2O_3$ (or $Al_2O_3$), fluorine tin oxide (FTO), and a combination thereof. A specific resistance of the front electrode 110 may be approximately $10^{-2}$ Ω·cm to $10^{-11}$ Ω·cm.

The front electrode 110 may be electrically connected to the photoelectric transformation unit 120. Hence, the front electrode 110 may collect carriers (for example, holes) produced by the incident light and may output the carriers.

A plurality of uneven patterns having a non-uniform pyramid structure may be formed on an upper surface of the front electrode 110. In other words, the front electrode 110 may have a textured surface. As above, when the surface of the front electrode 110 is textured, a reflectance of incident light may be reduced, and an absorptance of light may increase. Hence, the efficiency of the thin film solar cell 10 may be improved.

Although FIG. 1 shows the textured surface of the front electrode 110, the photoelectric transformation unit 120 may have a textured surface. In the embodiment of the invention, only the textured surface of the front electrode 110 is described below for the sake of convenience of explanation.

The back electrode 140 may be formed of metal with high electrical conductivity so as to increase a recovery efficiency of electric power produced by the photoelectric transformation unit 120. The back electrode 140 electrically connected to the photoelectric transformation unit 120 may collect carriers (for example, electrons) produced by incident light and may output the carriers.

The photoelectric transformation unit 120 may convert light from the outside into electrical energy. The photoelectric transformation unit 120 may be a silicon cell using microcrystalline silicon, for example, hydrogenated microcrystalline silicon (mc-Si:H). The photoelectric transformation unit 120 may include a p-type semiconductor layer 121, an intrinsic (called i-type) semiconductor layer 122, and an n-type semiconductor layer 123 that are sequentially formed on the front electrode 110 in the order named.

The p-type semiconductor layer 121 may be formed using a gas obtained by adding impurities of a group III element, such as boron (B), gallium (Ga), and indium (In), to a raw gas containing silicon (Si).

The i-type semiconductor layer 122 may reduce recombination of the carriers and may absorb light. The i-type semiconductor layer 122 may absorb incident light to produce carriers such as electrons and holes. The i-type semiconductor layer 122 may contain microcrystalline silicon, for example, hydrogenated microcrystalline silicon (mc-Si:H).

The n-type semiconductor layer 123 may be formed using a gas obtained by adding impurities of a group V element, such as phosphorus (P), arsenic (As), and antimony (Sb), to a raw gas containing silicon (Si).

The photoelectric transformation unit 120 may be formed using a chemical vapor deposition (CVD) method, such as a plasma enhanced chemical vapor deposition (PECVD) method.

In the photoelectric transformation unit 120, the p-type semiconductor layer 121 and the n-type semiconductor layer 123 may form a p-n junction with the i-type semiconductor layer 122 interposed therebetween. In other words, the i-type semiconductor layer 122 is positioned between the p-type semiconductor layer 121 (i.e., a p-type doped layer) and the n-type semiconductor layer 123 (i.e., an n-type doped layer).

In such a structure of the thin film solar cell 10, when light is incident on the p-type semiconductor layer 121, a depletion region is formed inside the i-type semiconductor layer 122 because of the p-type semiconductor layer 121 and the n-type semiconductor layer 123 each having a relatively high doping concentration, thereby generating an electric field. Electrons and holes generated in the i-type semiconductor layer 122 being a light absorbing layer are separated by a contact potential difference through a photovoltaic effect and move in different directions. For example, the holes may move to the front electrode 110 through the p-type semiconductor layer 121, and the electrons may move to the back electrode 140 through the n-type semiconductor layer 123. Hence, electric power is produced.

Figure 2:
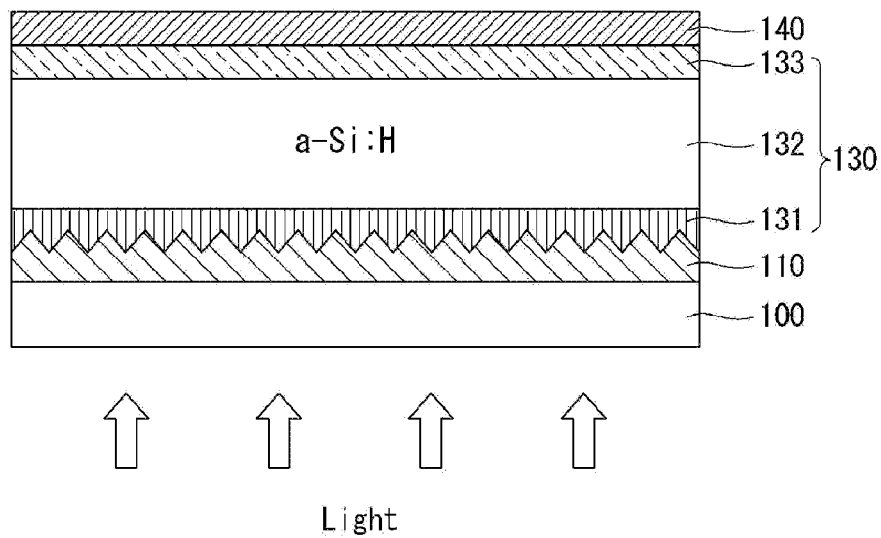

FIG. 2 shows a photoelectric transformation unit 130 of the thin film solar cell 10 that is a silicon cell using amorphous silicon (a-Si), for example, hydrogenated amorphous silicon (a-Si:H). In the structure of the photoelectric transformation unit 130, an intrinsic (called i-type) semiconductor layer 132 may contain amorphous silicon (a-Si), for example, hydrogenated amorphous silicon (a-Si:H).

As above, even if the i-type semiconductor layer 132 is formed of amorphous silicon, electric power may be produced.

Figure 3:
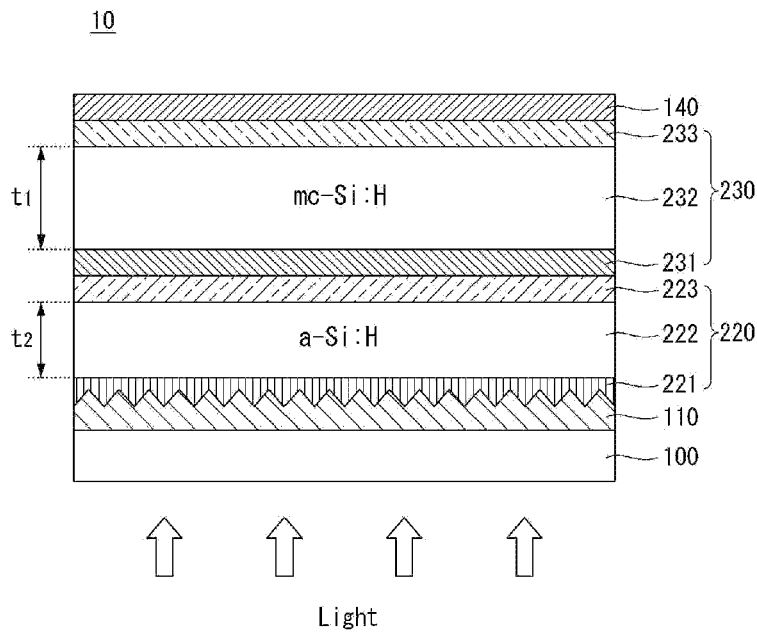
Figure 4:
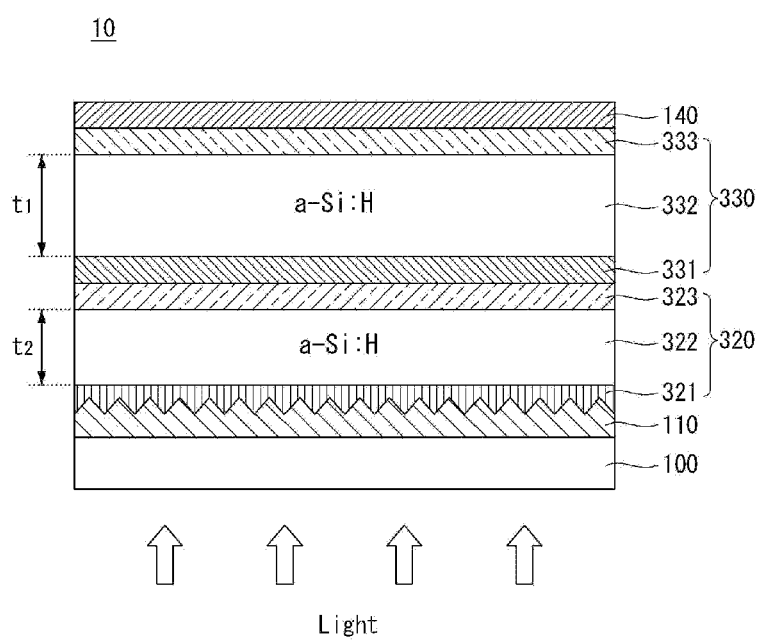

The thin film solar cell 10 shown in FIGS. 3 and 4 may be referred to as a double junction solar cell or a pin-pin solar cell. In the following description, a further description of structures and components identical or equivalent to those illustrated in FIGS. 1 and 2 may be briefly made or may be entirely omitted.

As shown in FIG. 3, the thin film solar cell 10 according to the embodiment of the invention may include a first photoelectric transformation unit 220 including a first i-type semiconductor layer 222 containing amorphous silicon (a-Si) and a second photoelectric transformation unit 230 including a second i-type semiconductor layer 232 containing microcrystalline silicon (mc-Si).

As shown in FIG. 3, in the thin film solar cell 10, a first p-type semiconductor layer 221, the first i-type semiconductor layer 222, a first n-type semiconductor layer 223, a second p-type semiconductor layer 231, the second i-type semiconductor layer 232, and a second n-type semiconductor layer 233 are sequentially stacked on an light incident surface of the substrate 100 in the order named.

The first i-type semiconductor layer 222 may mainly absorb light of a short wavelength band to produce electrons and holes. The second i-type semiconductor layer 232 may mainly absorb light of a long wavelength band to produce electrons and holes.

As above, because the double junction solar cell 10 absorbs light of the short wavelength band and light of the long wavelength band to produce carriers, the efficiency of the double junction solar cell 10 is improved.

Further, a thickness t1 of the second i-type semiconductor layer 232 may be greater than a thickness t2 of the first i-type semiconductor layer 222, so as to sufficiently absorb light of the long wavelength band.

Alternatively, as shown in FIG. 4 the thin film solar cell 10 according to the embodiment of the invention may include a first photoelectric transformation unit 320 including a first i-type semiconductor layer 322 containing amorphous silicon (a-Si) and a second photoelectric transformation unit 330 including a second i-type semiconductor layer 332 containing amorphous silicon (a-Si). In other words, the two i-type semiconductor layers 322 and 332 of the double junction solar cell 10 may be formed of amorphous silicon.

Even in this case, the first i-type semiconductor layer 322 may mainly absorb light of a short wavelength band to produce electrons and holes. The second i-type semiconductor layer 332 may mainly absorb light of a long wavelength band to produce electrons and holes. Further, a thickness t1 of the second i-type semiconductor layer 332 may be greater than a thickness t2 of the first i-type semiconductor layer 322, so as to sufficiently absorb light of the long wavelength band.

The thin film solar cell shown in FIGS. 5 to 8 may be referred to as a pin-pin-pin type solar cell or a triple junction solar cell. In the following description, a further description of structures and components identical or equivalent to those illustrated in FIGS. 1 to 4 may be briefly made or may be entirely omitted.

Figure 5:
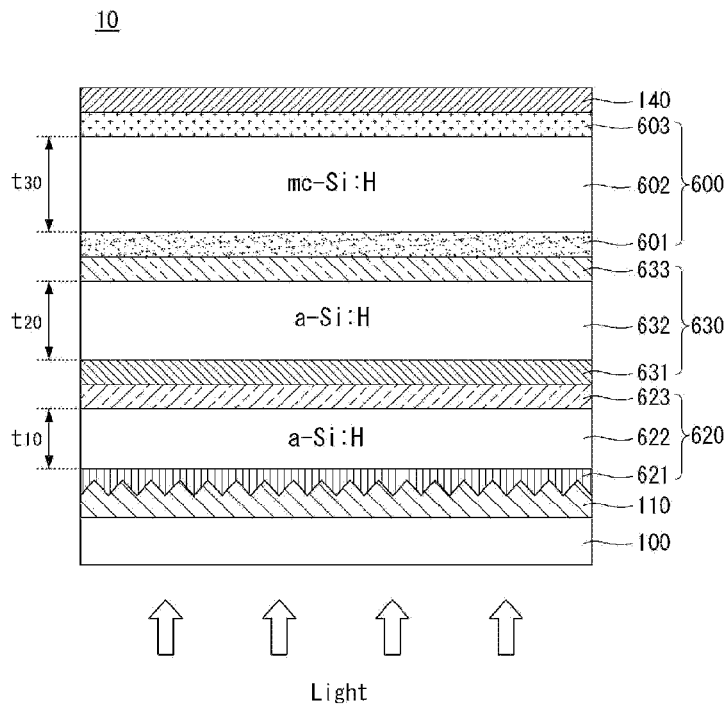

As shown in FIG. 5, the thin film solar cell 10 according to the embodiment of the invention may include a first photoelectric transformation unit 620 including a first i-type semiconductor layer 622 formed of amorphous silicon (a-Si), a second photoelectric transformation unit 630 including a second i-type semiconductor layer 632 formed of amorphous silicon (a-Si), and a third photoelectric transformation unit 600 including a third i-type semiconductor layer 602 formed of microcrystalline silicon (mc-Si).

The first photoelectric transformation unit 620, the second photoelectric transformation unit 630, and the third photoelectric transformation unit 600 may be sequentially positioned on the light incident surface of the substrate 100 in the order named.

More specifically, a first p-type semiconductor layer 621, the first i-type semiconductor layer 622, a first n-type semiconductor layer 623, a second p-type semiconductor layer 631, the second i-type semiconductor layer 632, a second n-type semiconductor layer 633, a third p-type semiconductor layer 601, the third i-type semiconductor layer 602, and a third n-type semiconductor layer 603 may be sequentially positioned on the substrate 100 in the order named.

The first photoelectric transformation unit 620 may be an amorphous silicon cell using amorphous silicon (a-Si), for example, hydrogenated amorphous silicon (a-Si:H). The first photoelectric transformation unit 620 may absorb light of short wavelength band to produce electric power.

The second photoelectric transformation unit 630 may be an amorphous silicon cell using amorphous silicon (a-Si), for example, hydrogenated amorphous silicon (a-Si:H). The second photoelectric transformation unit 630 may absorb light of a middle wavelength band between a short wavelength band and a long wavelength band to produce electric power.

The third photoelectric transformation unit 600 may be a silicon cell using microcrystalline silicon (mc-Si), for example, hydrogenated microcrystalline silicon (mc-Si:H). The third photoelectric transformation unit 600 may absorb light of long wavelength band to produce electric power.

A thickness t30 of the third i-type semiconductor layer 602 may be greater than a thickness t20 of the second i-type semiconductor layer 632, and the thickness t20 of the second i-type semiconductor layer 632 may be greater than a thickness t10 of the first i-type semiconductor layer 622.

Because the triple junction solar cell shown in FIG. 5 may absorb light of a wide band, the production efficiency of the electric power may increase.

Figure 6:
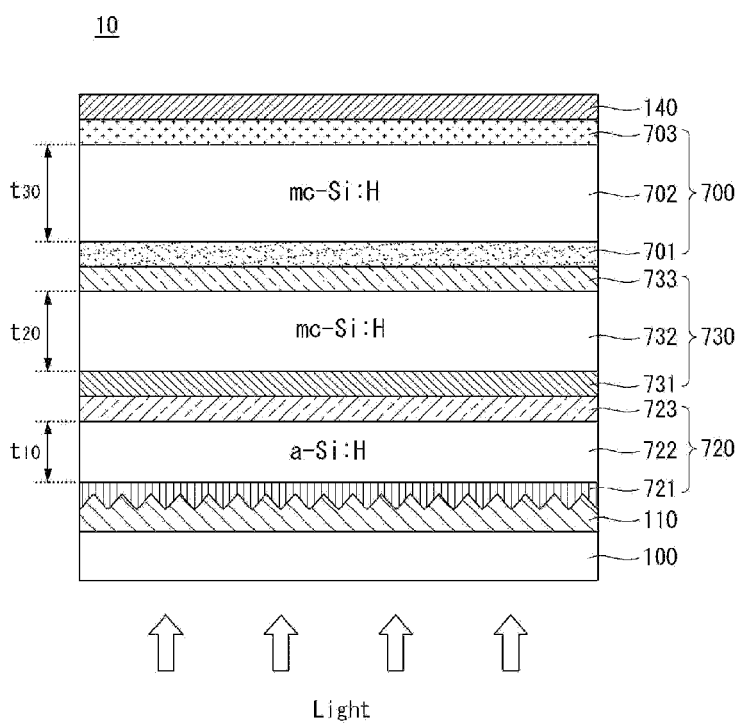

Alternatively, as shown in FIG. 6, the thin film solar cell 10 according to the embodiment of the invention may include a first photoelectric transformation unit 720 including a first i-type semiconductor layer 722 formed of amorphous silicon (a-Si), a second photoelectric transformation unit 730 including a second i-type semiconductor layer 732 formed of microcrystalline silicon (mc-Si), and a third photoelectric transformation unit 700 including a third i-type semiconductor layer 702 formed of microcrystalline silicon (mc-Si).

In other words, at least two of the three i-type semiconductor layers 722, 732, and 702 may be formed of microcrystalline silicon (mc-Si).

Further, an interlayer may be positioned between at least two of the plurality of photoelectric transformation units.

Figure 7:
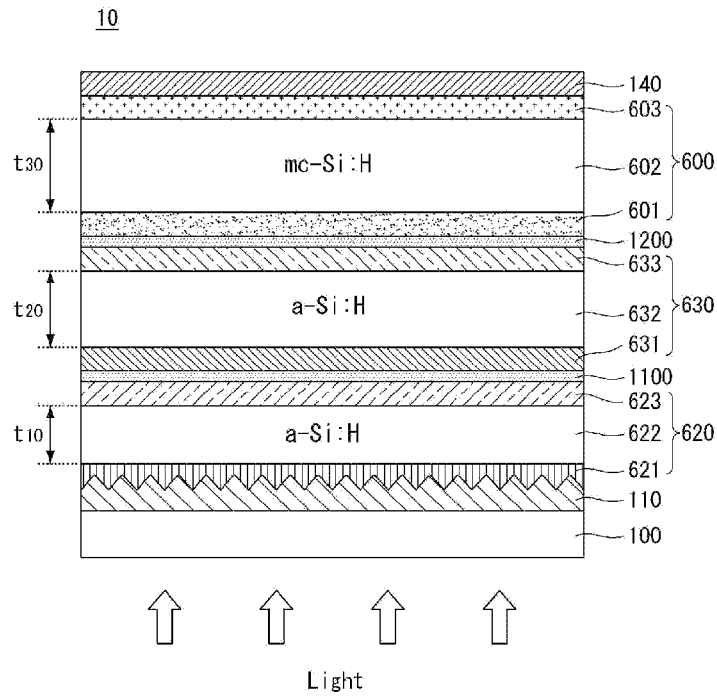

For example, as shown in FIG. 7, a first interlayer 1100 may be positioned between the first photoelectric transformation unit 620 and the second photoelectric transformation unit 630. A second interlayer 1200 may be positioned between the second photoelectric transformation unit 630 and the third second photoelectric transformation unit 600

Further, the first and second interlayers 1100 and 1200 reduce a thickness of the first i-type semiconductor layer 622 and a thickness of the second i-type semiconductor layer 632, thereby improving the stability efficiency.

After the i-type semiconductor layer is manufactured, the efficiency of the i-type semiconductor layer may be reduced during a predetermined incident period of light. For example, during the predetermined incident period of light, the efficiency of the i-type semiconductor layer may be reduced to about 80% to 85% of an initial efficiency measured immediately after the i-type semiconductor layer is manufactured.

Afterwards, a reduction amount of the efficiency of the i-type semiconductor layer is saturated, and the efficiency of the i-type semiconductor layer reaches a uniform efficiency. This is referred to as the stability efficiency.

The characteristic, in which the efficiency of the i-type semiconductor layer falls from the initial efficiency to the stability efficiency, may deepen as a thickness of the i-type semiconductor layer increases. In other words, as the thickness of the i-type semiconductor layer decreases, the stability efficiency may increase. However, if the thickness of the i-type semiconductor layer excessively decreases, a light absorptance of the i-type semiconductor layer may be reduced. Hence, the efficiency of the thin film solar cell 10 may be reduced.

On the other hand, as shown in FIG. 7, when the first and second interlayers 1100 and 1200 are disposed, the first and second interlayers 1100 and 1200 may again reflect light transmitted by the first or second photoelectric transformation unit 620 or 630 and allow the light to be absorbed in the first or second photoelectric transformation unit 620 or 630. Hence, even if the thickness of the first i-type semiconductor layer 622 of the first photoelectric transformation unit 620 and the thickness of the second i-type semiconductor layer 632 of the second photoelectric transformation unit 630 decrease, a reduction in the efficiency of the thin film solar cell 10 may be prevented. Further, the stability efficiency may be improved.

The first and second interlayers 1100 and 1200 may be formed of a material with a low light absorptance capable of efficiently reflecting light transmitted by the first or second photoelectric transformation unit 620 or 630. Preferably, the first and second interlayers 1100 and 1200 may be formed of the material, such as ZnO and SiOx, in consideration of the low light absorptance and the low manufacturing cost.

Further, it may be preferable that a light absorptance of the first i-type semiconductor layer 622 in the short wavelength band increases, so as to further increase the efficiency of the thin film solar cell 10. Hence, it may be preferable that the first interlayer 1100 efficiently reflects the light of short wavelength band. For this, it may be preferable that a refractive index of the first interlayer 1100 in the short wavelength band is relatively large.

Further, it may be preferable that a light absorptance of the second i-type semiconductor layer 632 in the middle or long wavelength band increases so as to further increase the efficiency of the thin film solar cell 10. For this, it may be preferable that a refractive index of the second interlayer 1200 in the middle or long wavelength band is relatively large.

It is assumed that there are a first wavelength band and a second wavelength band longer than the first wavelength band.

It may be preferable that the refractive index of the first interlayer 1100 is greater than the refractive index of the second interlayer 1200 in the first wavelength band, and the refractive index of the first interlayer 1100 is less than the refractive index of the second interlayer 1200 in the second wavelength band longer than the first wavelength band. Alternatively, the refractive index of the first interlayer 1100 may be equal to or less than the refractive index of the second interlayer 1200.

One of the first interlayer 1100 and the second interlayer 1200 may be omitted in the structure shown in FIG. 7.

Figure 8:
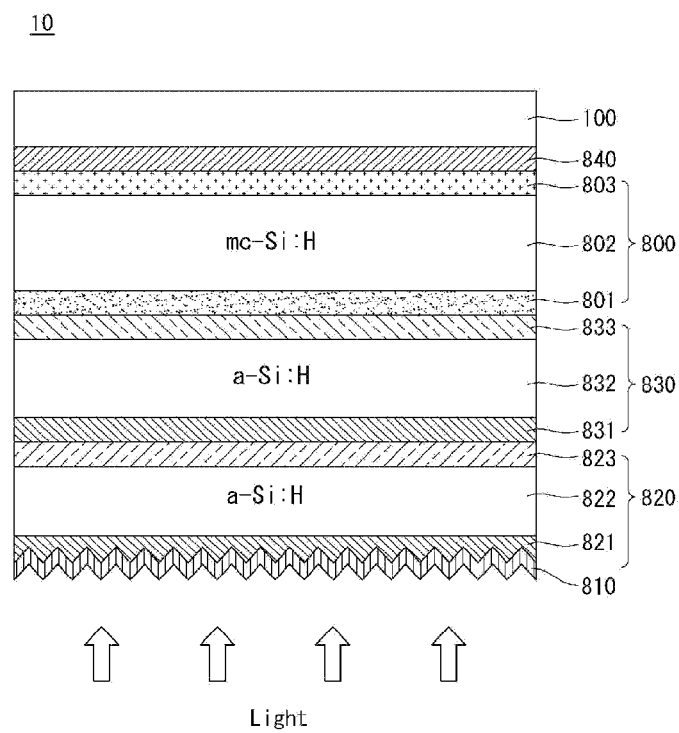

Alternatively, as shown in FIG. 8, the semiconductor layers may be positioned opposite the light incident surface of the substrate 100. Namely, a third n-type semiconductor layer 803, a third i-type semiconductor layer 802, a third p-type semiconductor layer 801, a second n-type semiconductor layer 833, a second i-type semiconductor layer 832, a second p-type semiconductor layer 831, a first n-type semiconductor layer 823, a first i-type semiconductor layer 822, and a first p-type semiconductor layer 821 may be sequentially positioned on the substrate 100 in the order named.

In the structure illustrated in FIG. 8, because light is incident on the surface opposite the light incident surface of the substrate 100 (i.e., the front electrode 810), the substrate 100 does not need to be substantially transparent. Hence, the substrate 100 may be formed of an opaque metal material other than glass and plastic.

The thin film solar cell 10 having the structure illustrated in FIG. 8 may be referred to as an nip solar cell.

Although it is not shown, the thin film solar cell 10 may further include a reflection layer (not shown) capable of reflecting transmitted light through its back surface.

FIGS. 9 to 22 illustrate a thin film solar cell module according to an exemplary embodiment of the invention.

As shown in FIG. 9, the thin film solar cell module according to the exemplary embodiment of the invention includes the plurality of cells positioned on the substrate. The plurality of cells are divided into at least two groups, for example, the first group 900 and the second group 910.

More specifically, as shown in FIG. 9, the thin film solar cell module includes the substrate 100 and the first group 900 and the second group 910 positioned on the substrate 100, which include a plurality of first cells 920 and a plurality of second cells 930, respectively. Because the structure of each of the first and second cells 920 and 930 was described in detail with reference to FIGS. 1 to 8, a further description may be briefly made or may be entirely omitted.

Two cells of the plurality of cells 920 and 930 are physically separated from each other. In other words, the two cells of the plurality of cells 920 and 930 do not contact each other. For this, an insulating layer may be positioned between the two cells.

For example, as shown in FIG. 9, an insulating layer 940 may be positioned between the first group 900 including the plurality of first cells 920 and the second group 910, adjacent to the first group 900, including the plurality of second cells 930.

The plurality of first cells 920 included in the first group 900 may be electrically connected in series to one another.

The plurality of second cells 930 included in the second group 910 may be electrically connected in series to one another.

As above, when the plurality of cells on the substrate 100 are divided into at least two groups and the cells included in each of the groups are electrically connected in series to one another, an output voltage may be easily adjusted.

Further, the plurality of first cells 920 included in the first group 900 may connected in parallel to the plurality of second cells 930 included in the second group 910. This is described in detail below with reference to FIG. 16.

A cross-sectional shape taken along a direction P crossing a longitudinal direction of the cells 920 and 930 on the substrate 100 is illustrated below.

As shown in FIG. 10, a second electrode 140 of a 1-1 cell A of the plurality of first cells 920 included in the first group 900 may be electrically connected to a first electrode 110 of a 1-2 cell B adjacent to the 1-1 cell A. Because the first electrode 110 is the front electrode and the second electrode 140 is the back electrode, the 1-1 cell A and the 1-2 cell B are electrically connected in series to each other.

Further, a first electrode 110 of a 2-1 cell C of the plurality of second cells 930 included in the second group 910 may be electrically connected to a second electrode 140 of a 2-2 cell D adjacent to the 2-1 cell C. Hence, the 2-1 cell C and the 2-2 cell D are electrically connected in series to each other.

In other words, supposing that there are the four successively positioned cells A, B, C, and D of the plurality of cells, the first electrode 110 of the first cell A and the second electrode 140 of the second cell B may be electrically connected to each other or the second electrode 140 of the first cell A and the first electrode 110 of the second cell B may be electrically connected to each other. The first electrode 110 of the third cell C and the second electrode 140 of the fourth cell D may be electrically connected to each other or the second electrode 140 of the third cell C and the first electrode 110 of the fourth cell D may be electrically connected to each other.

Further, the first electrode 110 of the second cell B and the second electrode 140 of the third cell C are separated from each other, and the second electrode 140 of the second cell B and the first electrode 110 of the third cell C are separated from each other.

A distance d1 between the 1-2 cell B and the 2-1 cell C needs to be sufficiently large, so as to electrically separate the first cell 920 from the second cell 930.

For this, the distance d1 between the second electrode 140 of the 1-2 cell B and the second electrode 140 of the 2-1 cell C may be greater than a distance d2 between the second electrode 140 of the 1-1 cell A and the second electrode 140 of the 1-2 cell B and a distance d3 between the second electrode 140 of the 2-1 cell C and the second electrode 140 of the 2-2 cell D.

Alternatively, the distance d1 between the first electrode 110 of the 1-2 cell B and the first electrode 110 of the 2-1 cell C may be greater than a distance d4 between the first electrode 110 of the 1-1 cell A and the first electrode 110 of the 1-2 cell B and a distance d5 between the first electrode 110 of the 2-1 cell C and the first electrode 110 of the 2-2 cell D.

When the distance d1 between the 1-2 cell B and the 2-1 cell C excessively increases, the number of cells positioned on the substrate 100 may decrease. Accordingly, the distance d1 between the first electrode 110 of the 1-2 cell B and the first electrode 110 of the 2-1 cell C or the distance d1 between the second electrode 140 of the 1-2 cell B and the second electrode 140 of the 2-1 cell C may be less than a width of one cell.

For example, the distance d1 between the first electrode 110 of the 1-2 cell B and the first electrode 110 of the 2-1 cell C or the distance d1 between the second electrode 140 of the 1-2 cell B and the second electrode 140 of the 2-1 cell C may be less than widths W3, W1, W2, and W4 of the 1-1,1-2, 2-1, and 2-2 cells A, B, C, and D or a minimum width of the first cell 920 or the second cell 930. Alternatively, the distance d1 between the first electrode 110 of the 1-2 cell B and the first electrode 110 of the 2-1 cell C or the distance d1 between the second electrode 140 of the 1-2 cell B and the second electrode 140 of the 2-1 cell C may be less than widths W10, W20, W30, and W40 of the first electrode 110 or a width of the second electrode 140. Alternatively, the distance d1 between the first electrode 110 of the 1-2 cell B and the first electrode 110 of the 2-1 cell C or the distance d1 between the second electrode 140 of the 1-2 cell B and the second electrode 140 of the 2-1 cell C may be less than at least one of a minimum width of the first electrode 110 and a minimum width of the second electrode 140.

FIG. 10 shows that the distance d1 between the first electrode 110 of the 1-2 cell B and the first electrode 110 of the 2-1 cell C is substantially equal to the distance d1 between the second electrode 140 of the 1-2 cell B and the second electrode 140 of the 2-1 cell C. However, the distance d1 between the first electrode 110 of the 1-2 cell B and the first electrode 110 of the 2-1 cell C may be different from the distance d1 between the second electrode 140 of the 1-2 cell B and the second electrode 140 of the 2-1 cell C.

A width of the first electrode 110 of at least one of the plurality of cells may be different from a width of the first electrode 110 of other cell.

For example, as shown in FIGS. 10 and 11, one side of the first electrode 110 of the 1-2 cell B has to be connected to the second electrode 140 of the 1-1 cell A, and the other side of the first electrode 110 of the 1-2 cell B may contact the insulating layer 940. Further, one side of the first electrode 110 of the 2-1 cell C has to be connected to the second electrode 140 of the 2-2 cell D, and the other side of the first electrode 110 of the 2-1 cell C may contact the insulating layer 940. Accordingly, the widths W10 and W20 of at least one of the first electrode 110 of the 1-2 cell B and the first electrode 110 of the 2-1 cell C may be greater than the widths W30 and W40 of at least one of the 1-1 cell A and the 2-2 cell D.

It may be preferable that widths of photoelectric transformation layers 1000 of the plurality of cells positioned on the substrate 100 are substantially equal to one another. In this case, because currents and voltages generated in the photoelectric transformation layers 1000 of the cells may be substantially equal to one another, a reduction in the power production may be prevented.

For example, when a width of a photoelectric transformation layer 1000 of any X-cell of the plurality of cells is less than a width of a photoelectric transformation layer 1000 of other cell, a current generated in the photoelectric transformation layer 1000 of the X-cell may be less than a current generated in the photoelectric transformation layer 1000 of the other cell. Hence, the power production of the thin film solar cell module may be reduced. Therefore, it is preferable that the widths of the photoelectric transformation layers 1000 of the plurality of cells positioned on the substrate 100 are substantially equal to one another.

In the manufacturing process of the thin film solar cell module, a process for physically separating the two successively positioned cells (for example, the 1-2 cell B and the 2-1 cell C in FIG. 10) from each other has to be additionally performed. Further, when the process for physically separating the two successively positioned cells is performed with the sufficiently high precision, a process error may be generated because of various factors. Hence, a width of a photoelectric transformation unit 1000 of one of the two physically separated cells may be less than a width of a photoelectric transformation unit 1000 of the other cell.

Accordingly, it may be preferable that the width of the photoelectric transformation unit 1000 of one of the two physically separated cells is greater than the width of the photoelectric transformation unit 1000 of the other cell in consideration of the process error.

For example, as shown in FIG. 10, at least one of the width W1 of the photoelectric transformation unit 1000 of the 1-2 cell B and the width W2 of the photoelectric transformation unit 1000 of the 2-1 cell C may be greater than the width W3 of the photoelectric transformation unit 1000 of the 1-1 cell A and the width W4 of the photoelectric transformation unit 1000 of the 2-2 cell D. As above, the width of the photoelectric transformation unit 1000 of at least one of the plurality of cells may be different from the width of the photoelectric transformation unit 1000 of the other cell.

Further, as shown in FIG. 10, shapes of the 1-1 and 1-2 cells A and B of the plurality of first cells 920 included in the first group 900 may be different from each other. Further, shapes of the 2-1 and 2-2 cells C and D of the plurality of second cells 930 included in the second group 910 may be different from each other.

For example, the 1-1 cell A has the structure in which the 1-1 cell A is electrically connected to the both first cells 920 adjacent to the 1-1 cell A. On the other hand, the 1-2 cell B has the structure in which the 1-2 cell B is electrically connected to the 1-1 cell A adjacent to the 1-2 cell B and is physically separated from the 2-1 cell C adjacent to the 1-2 cell B. Therefore, the shapes of the 1-1 and 1-2 cells A and B may be different from each other. Further, the shapes of the 2-1 and 2-2 cells C and D may be different from each other in the same manner as the 1-1 and 1-2 cells A and B.

The first cell 920 of the first group 900 may be symmetrical to the second cell 930 of the second group 910. For example, the 1-1 cell A and the 2-2 cell D may be symmetrical to each other with respect to the X-axis, and the 1-2 cell B and the 2-1 cell C may be symmetrical to each other with respect to the X-axis. The symmetric shape of the two cells in the embodiment of the invention may indicate the completely symmetric shape or the symmetric tendency between the two cells. For example, the first electrode 110 of the 1-2 cell B extends further than the second electrode 140 of the 1-2 cell B in a direction toward one side of the substrate 100, and the first electrode 110 of the 2-1 cell C extends further than the second electrode 140 of the 2-1 cell C in a direction toward the other side opposite the one side of the substrate 100.

As shown in FIG. 11, the insulating layer 940 may be positioned between the first cell 920 (i.e., the 1-2 cell B) closest to the second group 910 among the first cells 920 included in the first group 900 and the second cell 930 (i.e., the 2-1 cell C) closest to the first group 900 among the second cells 930 included in the second group 910, so as to prevent the first cells 920 from contacting the second cells 930.

The insulating layer 940 may be formed of synthetic resin material. For example, the insulating layer 940 may be formed of ethylene vinyl acetate (EVA), polyvinyl butyral, ethylene vinyl acetate partial oxide, silicon resin, ester-based resin, olefin-based resin, and the like.

The insulating layer 940 may be positioned on the first and second cells 920 and 930 as well as between the first and second cells 920 and 930. In this case, the insulating layer 940 may prevent a corrosion of the first and second electrodes 110 and 140 resulting from the moisture penetration and may protect the first and second cells 920 and 930 from a pollution and an impact. The insulating layer 940 may be formed using a laminating method.

An exemplary method for manufacturing the thin film solar cell module shown in FIG. 10 is described below.

As shown in FIG. 12(a), a first electrode material layer 1200 may be formed on the substrate 100.

Next, as shown in FIG. 12(b), a portion of the first electrode material layer 1200 may be etched. For example, a portion of the first electrode material layer 1200 may be removed by applying a laser beam to the first electrode material layer 1200 based on a predetermined pattern. Hence, an exposed portion 1210 of the substrate 100 exposed by the first electrode material layer 1200 may be formed.

A width of a first portion 1201 of the first electrode material layer 1200 formed by the patterning may be greater than widths of other portions. This is to prevent an excessive reduction in widths of the two cells without a contact between the two cells.

Next, as shown in FIG. 12(c), a photoelectric transformation material layer 1220 may be formed on the patterned first electrode material layer 1200. The photoelectric transformation material layer 1220 may be formed by sequentially depositing p-type, i-type, and n-type semiconductor materials.

Next, as shown in FIG. 12(d), a portion of the photoelectric transformation material layer 1220 may be etched based on a predetermined pattern. Hence, an exposed portion 1230 of the first electrode material layer 1200 exposed by the photoelectric transformation material layer 1220 may be formed.

Next, as shown in FIG. 13(e), a second electrode material layer 1340 may be formed on the patterned photoelectric transformation material layer 1220.

Next, as shown in FIG. 13(f), a portion of the second electrode material layer 1340 may be etched. For example, the second electrode material layer 1340 may be formed to have a predetermined pattern by applying a laser beam to the second electrode material layer 1340.

The second electrode material layer 1340 may have an exposed portion 1350 of the first electrode material layer 1200, and an exposed portion 1360 of the substrate 100 may be formed.

Figure 12:
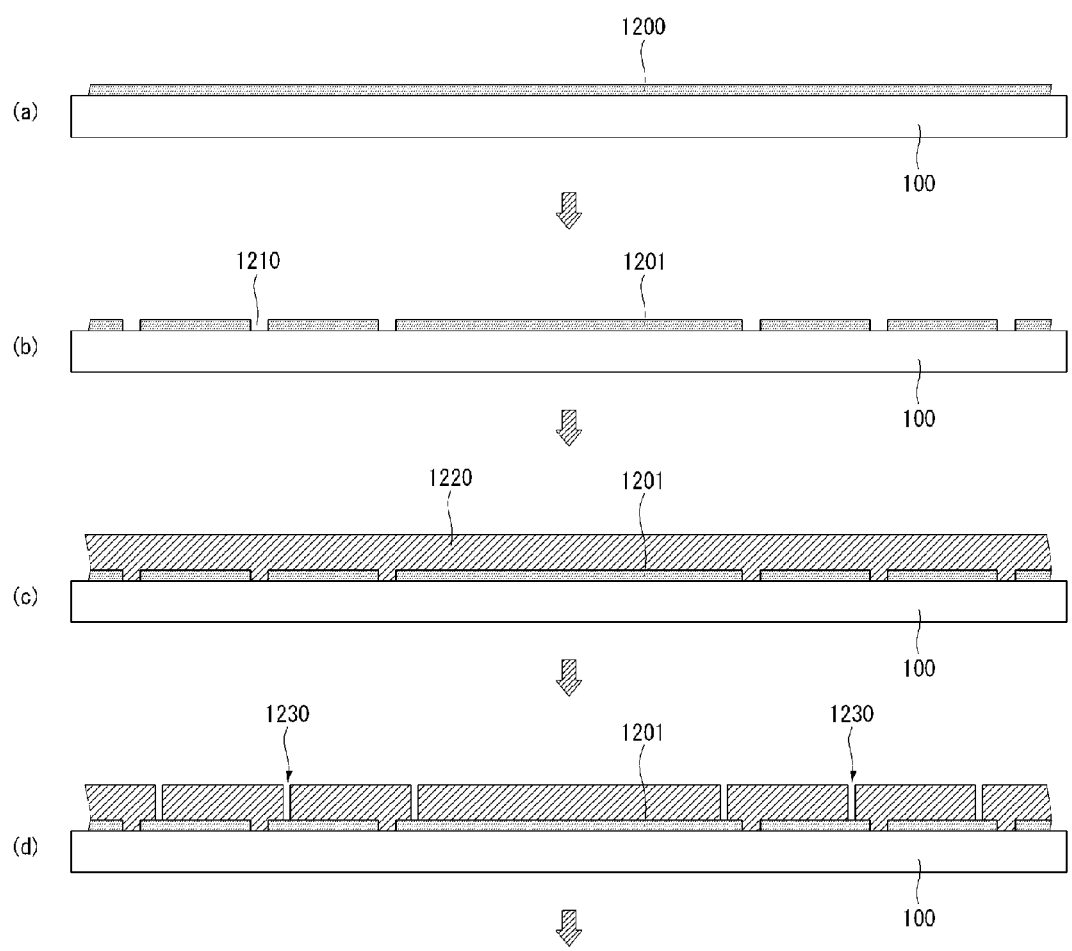
Figure 13:
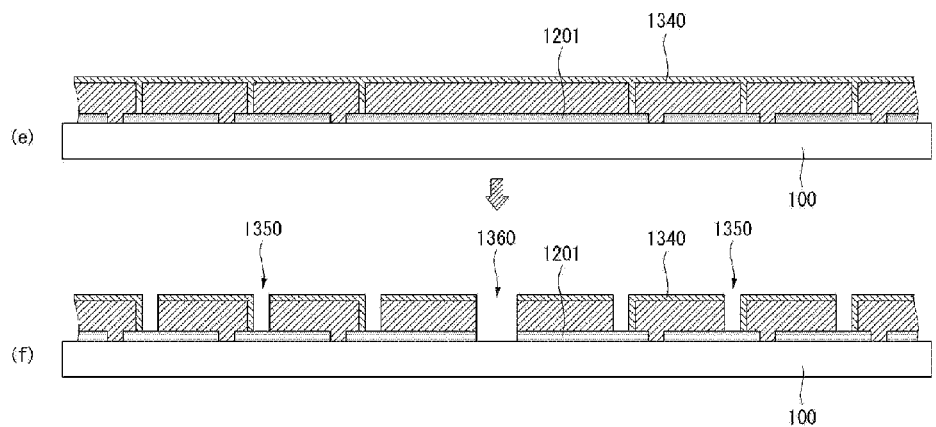

The plurality of cells may be connected in series to one another, and the two cells of the plurality of cells may be separated from each other using the method illustrated in FIGS. 12 and 13.

Figure 14:
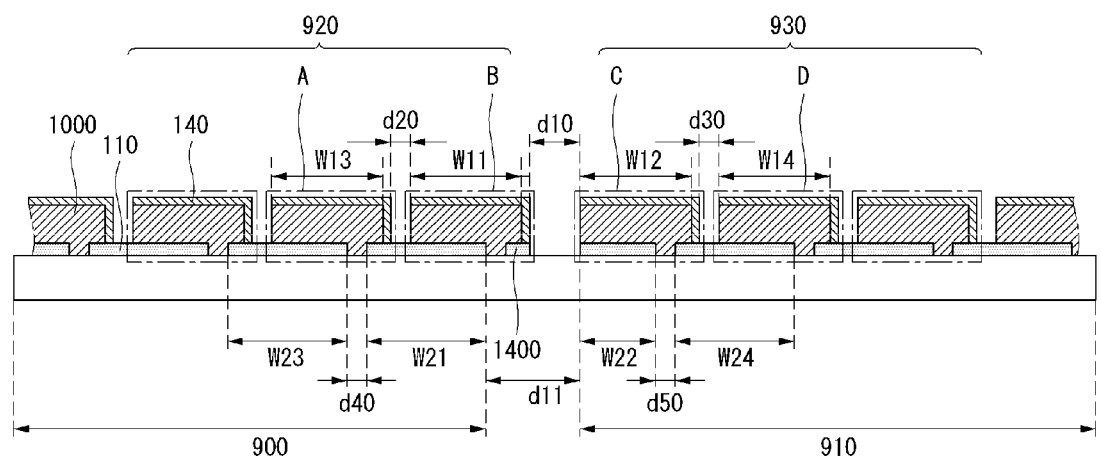

As shown in FIG. 14, the plurality of cells positioned on the substrate 100 may be arranged in the same pattern. In the following description, a further description of structures and components identical or equivalent to those illustrated in FIGS. 10 to 13 may be briefly made or may be entirely omitted.

For example, supposing that there are four successively positioned cells A, B, C, and D of the plurality of cells, the second electrode 140 of the first cell A and the first electrode 110 of the second cell B may be electrically connected to each other, and the second electrode 140 of the third cell C and the first electrode 110 of the fourth cell D may be electrically connected to each other. Further, the first electrode 110 of the second cell B and the second electrode 140 of the third cell C may be separated from each other, and the second electrode 140 of the second cell B and the first electrode 110 of the third cell C may be separated from each other. In other words, the first cells 920 of the first group 900 and the second cells 930 of the second group 910 are arranged in the same pattern. FIG. 10 illustrates that the first cells 920 of the first group 900 and the second cells 930 of the second group 910 are arranged in different directions.

In this case, the plurality of first cells 920 of the first group 900 may be electrically connected in series to one another, and the plurality of second cells 930 of the second group 910 may be electrically connected in series to one another.

Further, a 1-1 cell A and a 1-2 cell B of the plurality of first cells 920 included in the first group 900 may have different shapes, and a 2-1 cell C and a 2-2 cell D of the plurality of second cells 930 included in the second group 910 may have different shapes.

For example, the 1-1 cell A has the structure in which the 1-1 cell A is electrically connected to the both first cells 920 adjacent to the 1-1 cell A. On the other hand, the 1-2 cell B has the structure in which the 1-2 cell B is electrically connected to the 1-1 cell A adjacent to the 1-2 cell B and is physically separated from the 2-1 cell C adjacent to the 1-2 cell B. Therefore, the shapes of the 1-1 and 1-2 cells A and B may be different from each other.

The 1-2 cell B may include a third electrode 1400, that is connected to the second electrode 140 of the 1-2 cell B and is not connected to the first and second electrodes 110 and 140 of the 2-1 cell C through a process for separating the 1-2 cell B and the 2-1 cell C. A width of the third electrode 1400 may be less than the widths of the first and second electrodes 110 and 140.

A distance d11 between the first electrode 110 of the 1-2 cell B and the first electrode 110 of the 2-1 cell C may be greater than a distance d10 between the second electrode 140 of the 1-2 cell B and the second electrode 140 of the 2-1 cell C through the process for separating the 1-2 cell B and the 2-1 cell C. Further, the distance d11 may be greater than a distance d40 between the first electrode 110 of the 1-1 cell A and the first electrode 110 of the 1-2 cell B and a distance d50 between the first electrode 110 of the 2-1 cell C and the first electrode 110 of the 2-2 cell D through the process for separating the 1-2 cell B and the 2-1 cell C.

One of a width W21 of the first electrode 110 of the 1-2 cell B and a width W22 of the first electrode 110 of the 2-1 cell C may be less than a width W23 of the first electrode 110 of the 1-1 cell A and a width W24 of the first electrode 110 of the 2-2 cell D through the process for separating the 1-2 cell B and the 2-1 cell C. For example, as shown in FIG. 14, the width W22 of the first electrode 110 of the 2-1 cell C may be less than the width W23 of the first electrode 110 of the 1-1 cell A and the width W24 of the first electrode 110 of the 2-2 cell D. In this case, the width W22 of the first electrode 110 of the 2-1 cell C may be less than the width W21 of the first electrode 110 of the 1-2 cell B.

It may be preferable that the distance d10 between the second electrode 140 of the 1-2 cell B and the second electrode 140 of the 2-1 cell C is greater than a distance d20 between the second electrode 140 of the 1-1 cell A and the second electrode 140 of the 1-2 cell B and a distance d30 between the second electrode 140 of the 2-1 cell C and the second electrode 140 of the 2-2 cell D, so as to prevent the 1-2 cell B from contacting the 2-1 cell C.

It may be preferable that at least one of widths W11 and W12 of photoelectric transformation units 1000 of the 1-2 cell B and the 2-1 cell C, that are positioned adjacent to each other in a boundary portion between the first group 900 and the second group 910, is greater than a width W13 of a photoelectric transformation unit 1000 of the 1-1 cell A and a width W14 of a photoelectric transformation unit 1000 of the 2-2 cell D, so as to prevent a reduction of the power production. Hence, this is to prevent at least one of the width W11 of the photoelectric transformation unit 1000 of the 1-2 cell B and the width W12 of the photoelectric transformation unit 1000 of the 2-1 cell C from being excessively less than widths of photoelectric transformation units 1000 of the other cells because of a process error, etc., generated in the process for separating the 1-2 cell B and the 2-1 cell C.

An exemplary method for manufacturing the thin film solar cell module shown in FIG. 14 is described below.

Figure 15:
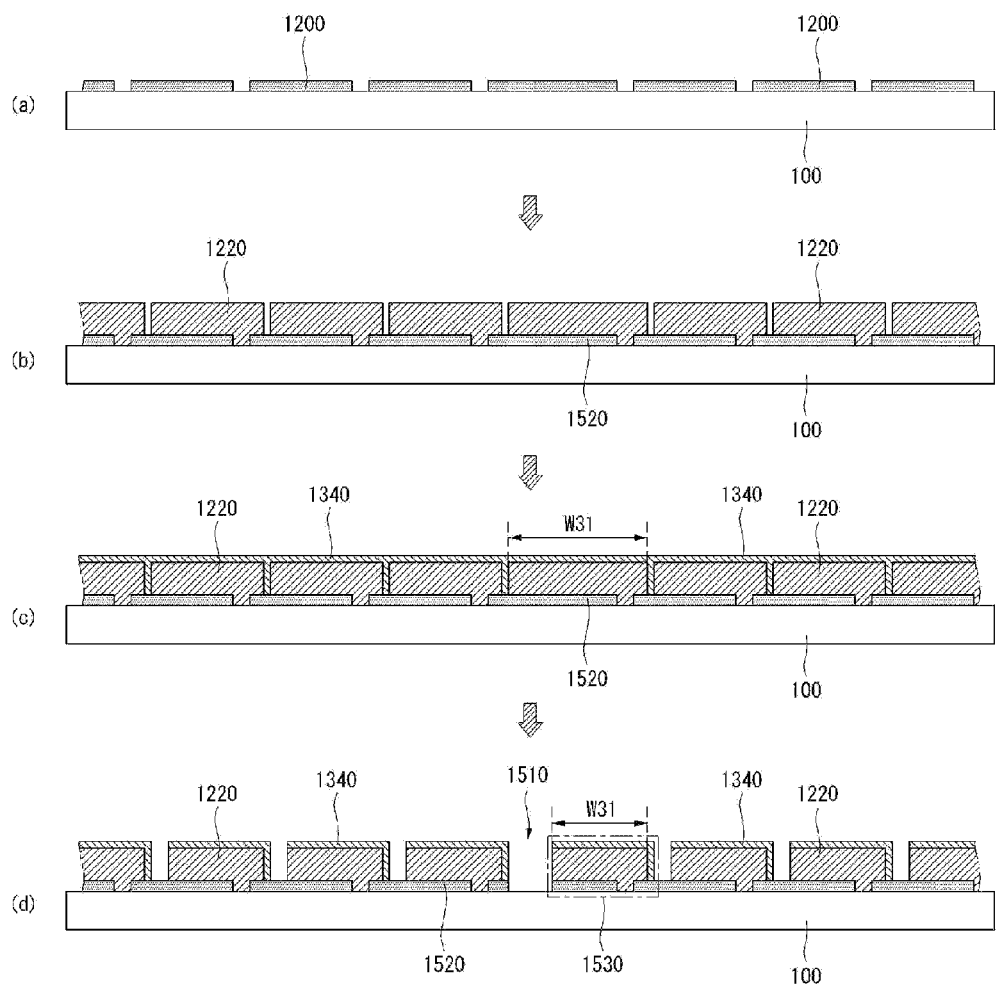

As shown in FIG. 15(*a*), a first electrode material layer 1200 may be formed on the substrate 100, and then a portion of the first electrode material layer 1200 may be etched.

Next, as shown in FIG. 15(*b*), a photoelectric transformation material layer 1220 may be formed on the patterned first electrode material layer 1200, and then a portion of the photoelectric transformation material layer 1220 may be etched based on a predetermined pattern.

In this case, the photoelectric transformation material layer 1220 may be patterned so that a width W31 of the photoelectric transformation material layer 1220 corresponding to a cell positioned between first and second areas is greater than widths of other portions. Further, a photoelectric transformation material layer 1520 may be patterned so that a width of the photoelectric transformation material layer 1520 corresponding to a cell positioned between the first and second areas is greater than widths of other portions. This is to prevent a width of a photoelectric transformation unit of the cell positioned between the first and second areas from excessively decreasing in a cell separation process performed in a subsequent process. The width W12 of the photoelectric transformation unit 1000 of the 2-1 cell C, that will be formed using the above-described method in a subsequent process, may be prevented from being less than widths of the photoelectric transformation units 1000 of other cells. The 2-1 cell C is described above as an example. However, the same structure as the 2-1 cell C may be applied to another cell (i.e., the 1-2 cell B) positioned in a boundary portion between the first and second areas.

Next, as shown in FIG. 15(*c*), a second electrode material layer 1340 may be formed on the patterned photoelectric transformation material layer 1220.

Next, as shown in FIG. 15(*d*), a portion of the second electrode material layer 1340 may be etched. For example, the second electrode material layer 1340 may be formed to have a predetermined pattern by applying a laser beam to the second electrode material layer 1340.

In the method illustrated in FIG. 15, an exposed portion of the first electrode material layer 1200 and an exposed portion 1510 of the substrate 100 may be formed in the second electrode material layer 1340. When the exposed portion 1510 of the substrate 100 is formed, an intensity of the laser beam or application time of the laser bean may increase so that all of the second electrode material layer 1340, the photoelectric transformation material layer 1220, and the first electrode material layer 1200 are etched.

The plurality of cells in a group may be connected in series to one another, and the two cells from each group adjacent to one another of the plurality of cells may be separated from each other using the method illustrated in FIG. 15.

The plurality of cells included in each group may be electrically connected in series to one another, and the cells included in the different groups may be electrically connected in parallel to one another.

In other words, the plurality of groups connected in parallel are formed on one substrate 100. For this, a bus bar electrode is connected to an outermost cell of each group, and the bus bar electrodes of the different groups are electrically connected in parallel to one another through lead wires. The lead wires are positioned on both the first and second groups 900 and 910.

The thin film solar cell module according to the embodiment of the invention may control an output voltage of the thin film solar cell module without a reduction in the efficiency of the thin film solar cell. Further, an edge portion of the thin film solar cell module does not need to widen so as to form the lead wires on both the first and second groups 900 and 910. As a result, an effective area of the thin film solar cell module may increase.

The parallel connection between the first and second groups 900 and 910 is described in detail below.

The first group may include a first outermost cell farthest from the second group and a second outermost cell closest to the second group, and the second group may include a third outermost cell closest to the first group and a fourth outermost cell farthest from the first group. In this case, a first bus bar electrode having a first polarity in the first outermost cell may be electrically connected in parallel to a bus bar electrode having the first polarity in one of the third and fourth outermost cells through first lead wires positioned on both the first and second groups. Further, a second bus bar electrode having a second polarity in the second outermost cell may be electrically connected in parallel to a bus bar electrode having the second polarity in the other of the third and fourth outermost cells through second lead wires positioned on both the first and second groups.

Figure 16:
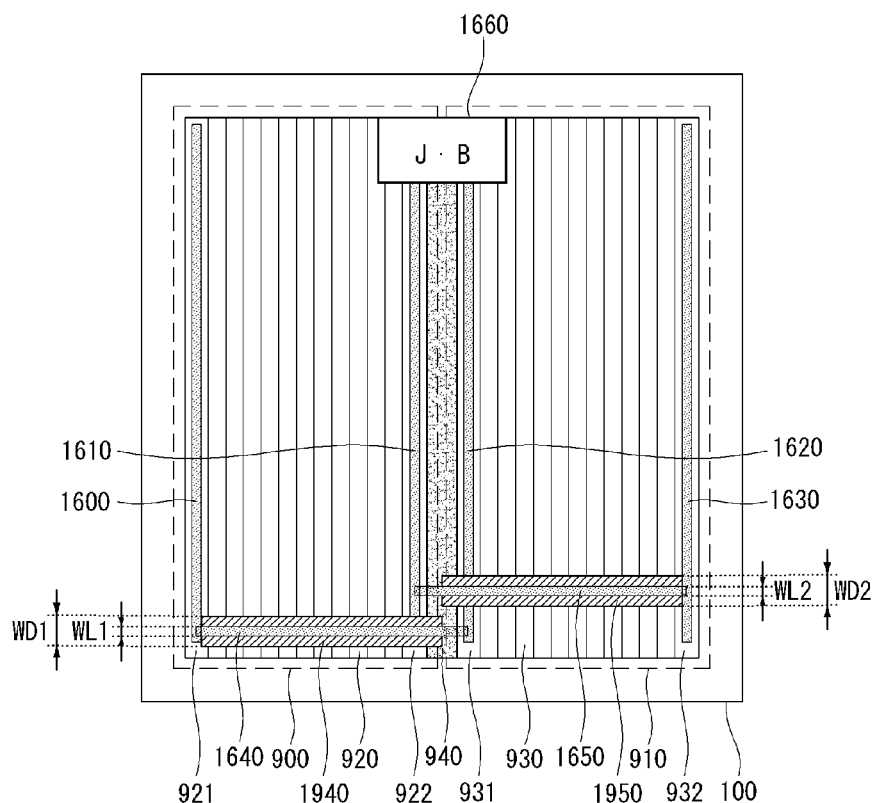

For example, as shown in FIG. 16, the first cells 920 of the first group 900 and the second cells 930 of the second group 910 may be connected in parallel to one another while the plurality of first cells 920 of the first group 900 are connected in series to one another, and the plurality of second cells 930 of the second group 910 are connected in series to one another.

More specifically, as shown in FIG. 16, when a first bus bar electrode 1600 having a first polarity in a first outermost cell 921 is electrically connected to a third bus bar electrode 1620 having the first polarity in a third outermost cell 931 through first lead wires 1640, a second bus bar electrode 1610 having a second polarity in a second outermost cell 922 may be electrically connected to a fourth bus bar electrode 1630 having the second polarity in a fourth outermost cell 932 through second lead wires 1650.

For this, the first bus bar electrode 1600 electrically connected to the first electrode 110 of the first outermost cell 921 may be positioned on the first outermost cell 921 of the first group 900. The second bus bar electrode 1610 electrically connected to the second electrode 140 of the second outermost cell 922 may be positioned on the second outermost cell 922 of the first group 900. Further, the third bus bar electrode 1620 electrically connected to the first electrode 110 of the third outermost cell 931 may be positioned on the third outermost cell 931 of the second group 910. The fourth bus bar electrode 1630 electrically connected to the second electrode 140 of the fourth outermost cell 932 may be positioned on the fourth outermost cell 932 of the second group 910.

The first lead wires 1640 may be positioned on the first group 900 so as to electrically connect the first bus bar electrode 1600 to the third bus bar electrode 1620. The second lead wires 1650 may be positioned on the second group 910 so as to electrically connect the second bus bar electrode 1610 to the fourth bus bar electrode 1630.

Figure 17:
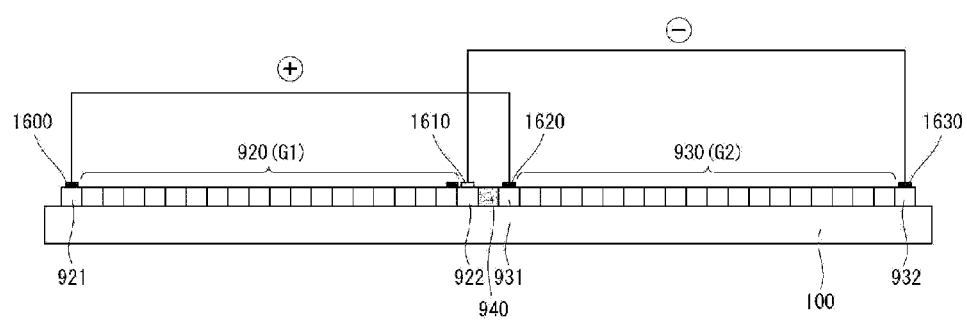

Each of the first and second lead wires 1640 and 1650 may connect bus bar electrodes having different polarities to each other. For example, as shown in FIG. 17, when the first bus bar electrode 1600 and the third bus bar electrode 1620 have the first polarity (for example, a positive polarity) and the second bus bar electrode 1610 and the fourth bus bar electrode 1630 have the second polarity (for example, a negative polarity), the first lead wires 1640 may connect the first bus bar electrode 1600 to the third bus bar electrode 1620 and the second lead wires 1650 may connect the second bus bar electrode 1610 to the fourth bus bar electrode 1630.

When the first to fourth bus bar electrodes 1600, 1610, 1620, and 1630 are connected to one another using the first and second lead wires 1640 and 1650 as above, the first lead wires 1640 may be positioned on the first group 900 and the second lead wires 1650 may be positioned on the second group 910.

An insulating layer formed of a nonconductive material may be formed in the first group 900 except the first lead wires 1640 and the first bus bar electrode 1600 and between the first lead wire 1630 and the second bus bar electrode 1610, so as to insulate the first group 900 except the first lead wire 1640 and the first bus bar electrode 1600, the second lead wire 1650, and the second bus bar electrode 1610.

A width WD1 of the insulating layer formed under the first lead wire 1640 may be greater than a width WL1 of the first lead wire 1640, so as to provide a stable insulation.

Further, an insulating layer formed of a nonconductive material may be formed in the second group 910 except the second lead wires 1650 and the fourth bus bar electrode 1630 and between the second lead wire 1650 and the third bus bar electrode 1620, so as to insulate the second group 910 except the second lead wire 1650 and the fourth bus bar electrode 1630, the second lead wire 1650, and the third bus bar electrode 1620.

A width WD2 of the insulating layer formed under the second lead wire 1650 may be greater than a width WL2 of the second lead wire 1650, so as to provide a stable insulation.

As above, the insulating layer positioned between the first lead wire 1640 and the first group 900 and the insulating layer positioned between the second lead wire 1650 and the second group 910 may be formed of synthetic resin material. For example, the insulating layer may be formed of ethylene vinyl acetate (EVA), polyvinyl butyral, ethylene vinyl acetate partial oxide, silicon resin, ester-based resin, olefin-based resin, and the like.

One bus bar electrode (for example, the second bus bar electrode 1610) belonging to the first group 900 and one bus bar electrode (for example, the third bus bar electrode 1620) belonging to the second group 910 may be electrically connected to a junction box 1660. Lengths of the second bus bar electrode 1610 and the third bus bar electrode 1620 electrically connected to the junction box 1660 may be shorter than lengths of the first bus bar electrode 1600 and the fourth bus bar electrode 1630.

The junction box 1660 may collect the electric power produced by the thin film solar cells of the thin film solar cell module and may include a bypass diode, a cable, and a connector.

The junction box 1660 may be positioned on both the first and second groups 900 and 910. Hence, the size of the thin film solar cell module may be reduced.

When the plurality of groups connected in parallel are positioned on one substrate 100 as above, the output voltage may be easily controlled.

It is assumed that all of cells formed on one substrate 100 are connected in series to one another as shown in FIG. 22. In this case, a first bus bar electrode 2210 may be positioned in one of a plurality of cells 2200, and a second bus bar electrode 2220 may be positioned in another cell of the plurality of cells 2200. Further, a junction box 2230 may collect an electric power produced by the cells 2200 through the first bus bar electrode 2210 and the second bus bar electrode 2220.

In the structure illustrated in FIG. 22, the output voltage is a sum of voltages produced by each of the cells 2200. Thus, a width of each of the cells 2200 has to be adjusted so as to control the output voltage. In this case, the thin film solar cell module has to be manufactured in consideration of the output voltage.

On the other hand, as shown in FIG. 16, when the first group 900 and the second group 910 on one substrate 100 are connected in parallel to one another, the output voltage may vary without adjusting a width of the cell. For example, supposing that the voltage produced by one cell is 2V, one group including the total of six cells connected in series may be formed so as to obtain the output voltage of 12V, and the plurality of groups may be connected in parallel to one another.

As above, as the plurality of groups on one substrate 100 are connected in parallel to one another, it is possible to obtain various output voltage such as 12V, 24V, and 48V. Hence, the thin film solar cell module may be easily applied to an off-grid system.

As shown in FIG. 16, when the plurality of groups are connected in parallel to one another, it may be preferable that the number of cells included in each group is equal to one another. Alternatively, the number of cells included in one of any two groups may be different from the number of cells included in the other group in consideration of the conditions of the manufacturing process, the manufacturing equipment, etc.

An output voltage of the double junction thin film solar cell shown in FIGS. 2 and 3 is higher than an output voltage of the single junction thin film solar cell shown in FIGS. 1 and 4. An output voltage of the triple junction thin film solar cell shown in FIGS. 5 to 8 may further increase.

When the plurality of photoelectric transformation units are stacked as in the double and triple junction thin film solar cells, a relatively high voltage may be easily obtained. However, it may be more difficult to obtain a relatively low voltage in the double and triple junction thin film solar cells than the single junction thin film solar cell.

Accordingly, when the plurality of photoelectric transformation units are stacked as in the double and triple junction thin film solar cells, it may be preferable that the plurality of cells positioned on one substrate 100 are divided into the plurality of groups each including the cells in consideration of the control of the output voltage.

Figure 18:
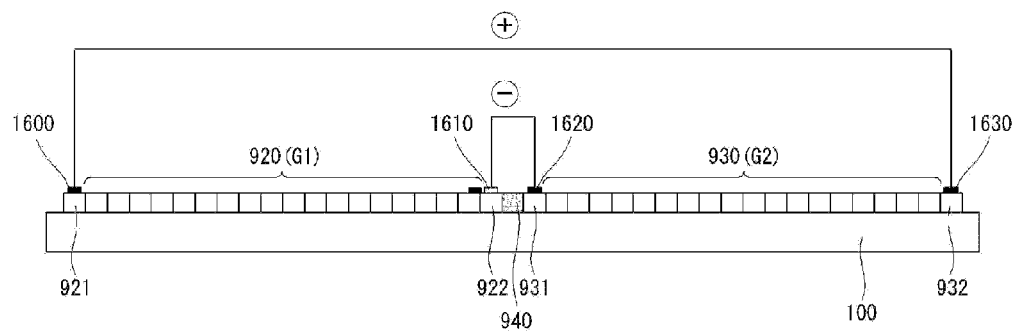
Figure 19:
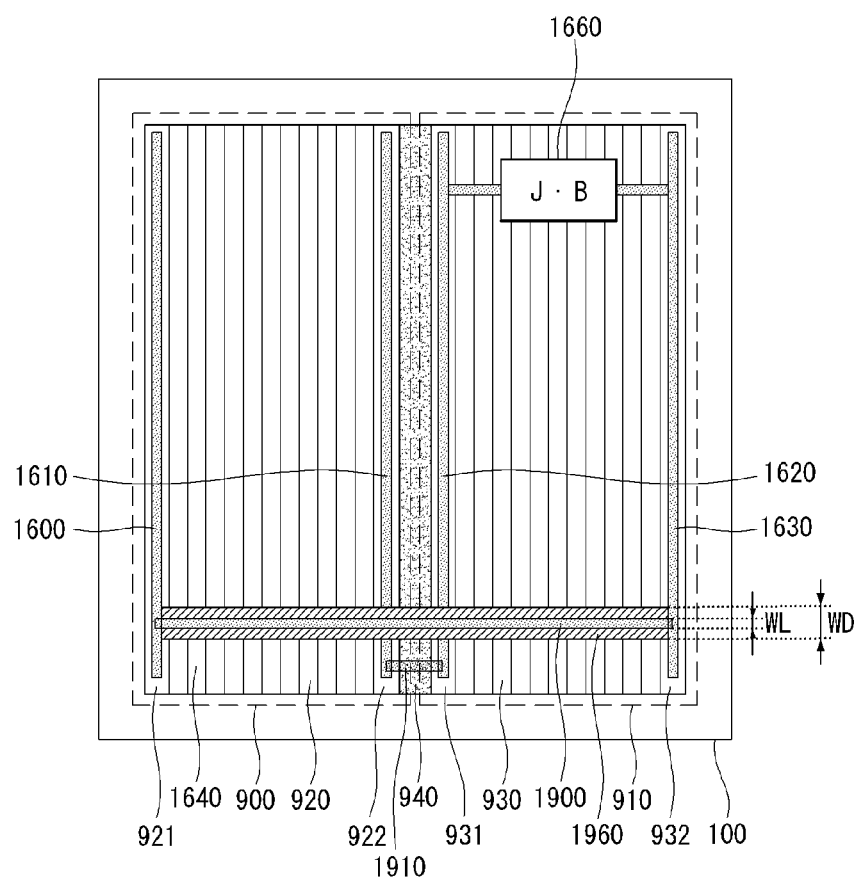

Unlike the structure illustrated in FIGS. 16 and 17, as shown in FIG. 18, when the first bus bar electrode 1600 having the first polarity in the first outermost cell 921 may be electrically connected in parallel to the fourth bus bar electrode 1630 having the first polarity in the fourth outermost cell 932 through the first lead wires 1640. Further, the second bus bar electrode 1610 having the second polarity in the second outermost cell 922 may be electrically connected in parallel to the third bus bar electrode 1620 having the second polarity in the third outermost cell 931 through the second lead wires 1650.

In the structure illustrated in FIG. 18, an insulating layer may further formed between the first lead wire 1640 and the first group 900 and between the first lead wire 1640 and the second group 910. A width WD of the insulating layer may be greater than a width WL of the first lead wire 1640.

In this case, the fourth bus bar electrode 1630 may be electrically connected to the first electrode 110 of the fourth outermost cell 932, and the third bus bar electrode 1620 may be electrically connected to the second electrode 140 of the third outermost cell 931. Further, the cells 920 of the first group 900 and the cells 930 of the second group 910 may be arranged in reverse in the same manner as structure illustrated in FIG. 10.

Figure 20:
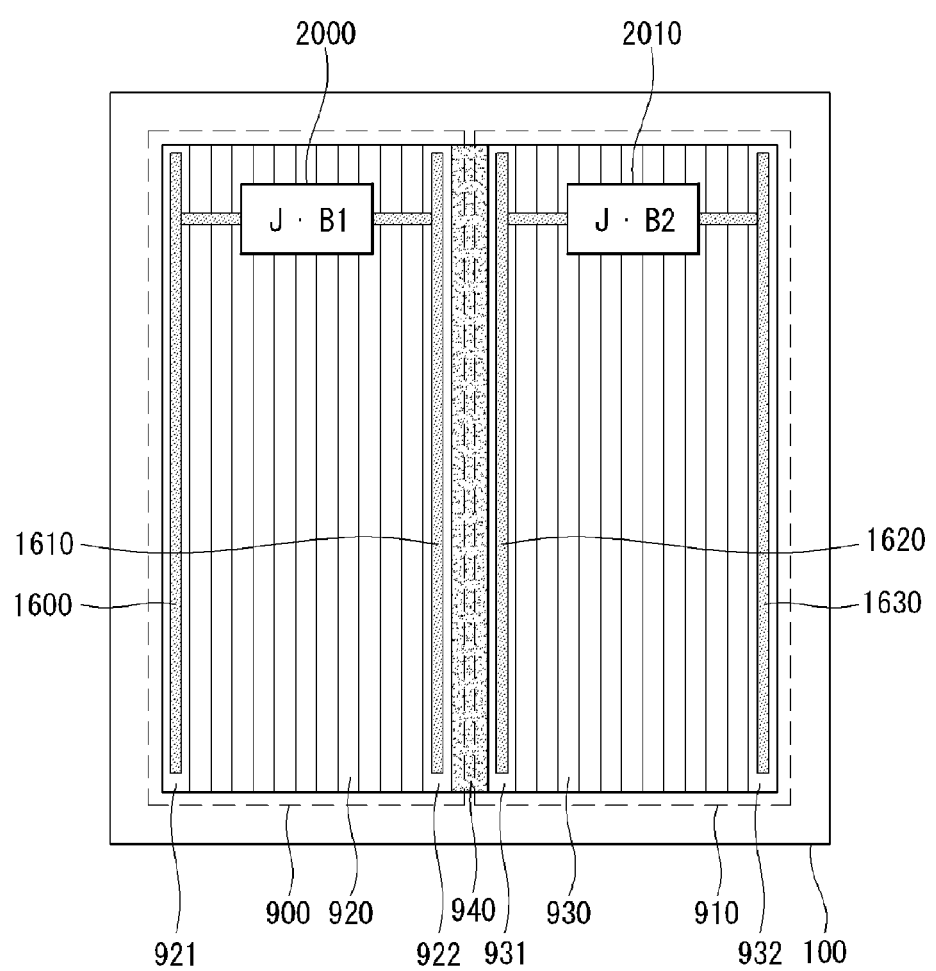

Further, as shown in FIG. 20, a plurality of junction boxes 2000 and 2010 may be formed so as to collect the electric power produced by each of the plurality of groups.

For example, as shown in FIG. 20, a first junction box 2000 may collect the electric power produced by the first cells 920, and a second junction box 2010 may collect the electric power produced by the second cells 930.

For this, the first junction box 2000 may be connected to the first bus bar electrode 1600 and the second bus bar electrode 1610, and the second junction box 2010 may be connected to the third bus bar electrode 1620 and the fourth bus bar electrode 1630.

When the plurality of junction boxes 2000 and 2010 collect the electric power produced by the plurality of groups, respectively, the plurality of groups do not need to be connected in parallel to one another. Hence, the lead wires used to connect the bus bar electrodes may be omitted.

Figure 21:
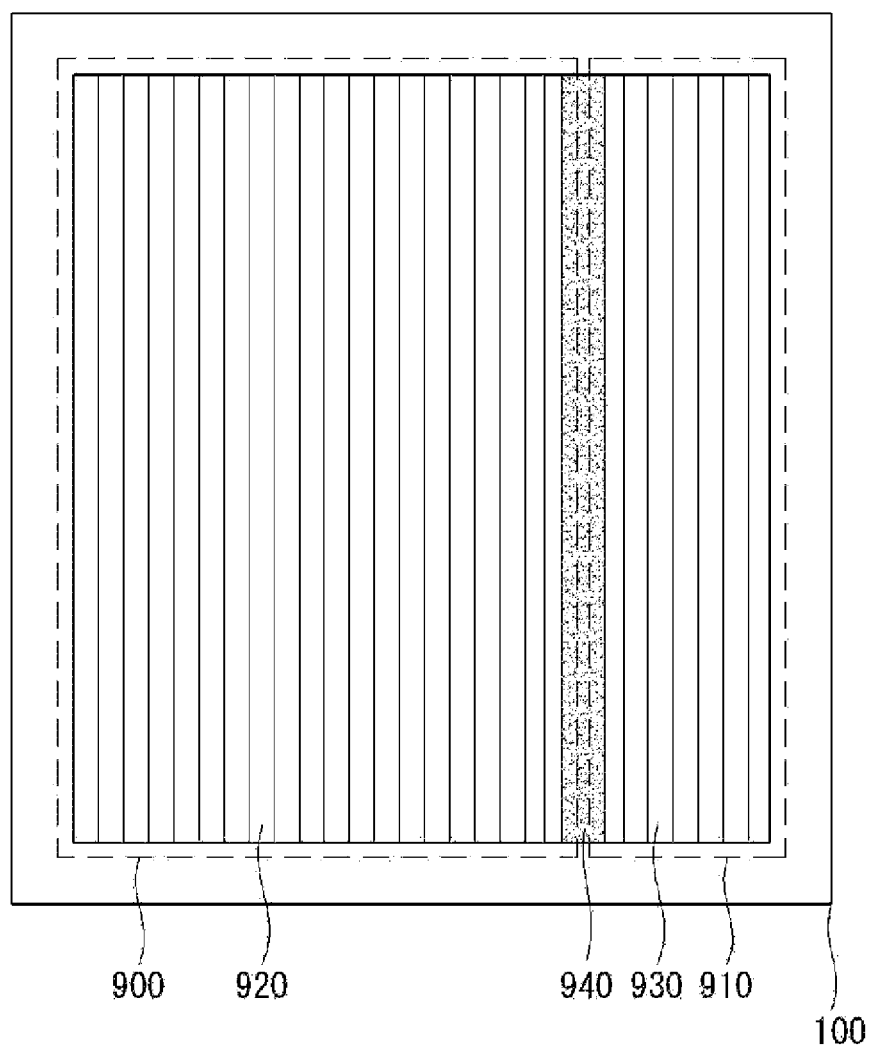

In the structure illustrated in FIG. 20, the number of cells in at least one of the plurality of groups may be different from the number of cells in another group in the same manner as the structure illustrated in FIG. 21.

For example, when the voltage produced by one cell is 2V, the number of first cells 920 included in the first group is 24, and the number of second cells 930 included in the second group is 12, the voltage of 48V and the voltage of 24V may be collected.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A thin film solar cell module comprising:
    a substrate;
    a plurality of cells each including a first electrode positioned on the substrate, a second electrode positioned on the first electrode, and a photoelectric transformation layer positioned between the first electrode and the second electrode,
    wherein the plurality of cells are divided into a first group and a second group, each group having first and second surfaces that oppose one another,
    wherein a plurality of cells included in the first group are electrically connected in series to one another, and a plurality of cells included in the second group are electrically connected in series to one another;
    at least one lead wire overlapped with at least one group of the first and second groups on one of the first or second surfaces with a crossing direction over a length direction of the plurality of cells comprised in the at least one group of the first and second groups, wherein the first group and the second group are electrically connected in parallel to connecting points of the first and second groups using the at least one lead wire;
    at least one insulating layer overlapped with the at least one group of the first and second groups on one of the first or second surfaces and positioned between the at least one lead wire and the second electrodes of the plurality of cells comprised in the at least one group of the first group and the second group with a crossing direction over a length direction of the plurality of cells comprised in the at least one group of the first and second groups, wherein a width of the at least one insulating layer is greater than a width of the at least one lead wire; and
    a junction box collecting electric power produced by the first and second groups, wherein the at least one lead wire is electrically connected to the junction box,
    wherein a remaining portion of the at least one lead wire except portions that are connected to the connecting points overlaps with the plurality of cells comprised in the at least one group of the first and second groups on one of the first or second surfaces, and wherein the junction box overlaps the at least one group.

2. The thin film solar cell module of claim 1, wherein the first group includes a first outermost cell farthest from the second group and a second outermost cell closest to the second group, and the second group includes a third outermost cell closest to the first group and a fourth outermost cell farthest from the first group,
    wherein the at least one lead wire includes a first lead wire and a second lead wire,
    wherein a first bus bar electrode having a first polarity in the first outermost cell is electrically connected in parallel to a bus bar electrode having the first polarity in one of the third and fourth outermost cells through the first lead wire positioned on at least the first group,
    wherein a second bus bar electrode having a second polarity in the second outermost cell is electrically connected in parallel to a bus bar electrode having the second polarity in the other of the third and fourth outermost cells through the second lead wire positioned at least between the first group and the second group.

3. The thin film solar cell module of claim 2, wherein the first bus bar electrode having the first polarity in the first outermost cell is electrically connected to a third bus bar electrode having the first polarity in the third outermost cell through the first lead wire positioned on the first group,
    wherein the second bus bar electrode having the second polarity in the second outermost cell is electrically connected to a fourth bus bar electrode having the second polarity in the fourth outermost cell through the second lead wire positioned on the second group.

4. The thin film solar cell module of claim 3, wherein the first bus bar electrode is positioned on the first outermost cell and is electrically connected to a first electrode of the first outermost cell,
    wherein the second bus bar electrode is positioned on the second outermost cell and is electrically connected to a second electrode of the second outermost cell,
    wherein the third bus bar electrode is positioned on the third outermost cell and is electrically connected to a first electrode of the third outermost cell,
    wherein the fourth bus bar electrode is positioned on the fourth outermost cell and is electrically connected to a second electrode of the fourth outermost cell.

5. The thin film solar cell module of claim 3, wherein the at least one insulating layer includes:
    a first insulating layer that is formed using a nonconductive material in the first group between the first lead wire and the second bus bar electrode and except the area where the first lead wire and the first bus bar electrode are connected; and a second insulating layer that is formed using a nonconductive material in the second group between the second lead wire and the third bus bar electrode and except the area where the second lead wire and the fourth bus bar electrode are connected.

6. The thin film solar cell module of claim 5, wherein a width of the first insulating layer is greater than a width of the first lead wire and a width of the second insulating layer is greater than a width of the second lead wire.

7. The thin film solar cell module of claim 3, wherein lengths of the second bus bar electrode and the third bus bar electrode are shorter than lengths of the first bus bar electrode and the fourth bus bar electrode.

8. The thin film solar cell module of claim 2, wherein the first bus bar electrode having the first polarity in the first outermost cell is electrically connected in parallel to a fourth bus bar electrode having the first polarity in the fourth outermost cell through the first lead wire positioned on the first group and the second group, wherein the second bus bar electrode having the second polarity in the second outermost cell is electrically connected in parallel to a third bus bar electrode having the second polarity in the third outermost cell through the second lead wire positioned between the first group and the second group.

9. The thin film solar cell module of claim 1, wherein the first group includes a first cell and a second cell and the second group includes a third cell and a fourth cell, wherein the first electrode of the first cell and the second electrode of the second cell are connected in series to each other, or the second electrode of the first cell and the first electrode of the second cell are connected in series to each other, wherein the first electrode of the third cell and the second electrode of the fourth cell are connected in series to each other, or the second electrode of the third cell and the first electrode of the fourth cell are connected in series to each other.

10. The thin film solar cell module of claim 9, wherein when the first to fourth cells are successively positioned, the first electrode of the second cell and the second electrode of the third cell are separated from each other, and the second electrode of the second cell and the first electrode of the third cell are separated from each other.

11. The thin film solar cell module of claim 10, wherein an insulating layer formed of a nonconductive material is positioned between the first and second groups on the substrate, wherein the first group and the second group are physically and electrically separated from each other by the insulating layer.

12. The thin film solar cell module of claim 10, wherein a distance between the second electrode of the second cell and the second electrode of the third cell is greater than a distance between the second electrode of the first cell and the second electrode of the second cell and a distance between the second electrode of the third cell and the second electrode of the fourth cell.

13. The thin film solar cell module of claim 10, wherein at least one of a distance between the first electrode of the second cell and the first electrode of the third cell and a distance between the second electrode of the second cell and the second electrode of the third cell is less than at least one of a width of the first electrode and a width of the second electrode.

14. The thin film solar cell module of claim 10, wherein a distance between the substrate and the first electrode is less than a distance between the substrate and the second electrode, wherein a distance between the first electrode of the second cell and the first electrode of the third cell is greater than a distance between the first electrode of the first cell and the first electrode of the second cell and a distance between the first electrode of the third cell and the first electrode of the fourth cell.

15. The thin film solar cell module of claim 10, wherein a width of the first electrode of at least one of the second and third cells is greater than widths of the first electrodes of the first and fourth cells.

16. The thin film solar cell module of claim 10, wherein a width of the first electrode of at least one of the second and third cells is less than widths of the first electrodes of the first and fourth cells.

17. The thin film solar cell module of claim 10, wherein a width of the photoelectric transformation layer of at least one of the second and third cells is different from widths of the photoelectric transformation layers of the first and fourth cells.

18. The thin film solar cell module of claim 10, wherein a width of the photoelectric transformation layer of at least one of the second and third cells is equal to or greater than widths of the photoelectric transformation layers of the first and fourth cells.

* * * * *